United States Patent [19]

Proebsting et al.

[11] Patent Number: 4,580,067

[45] Date of Patent: Apr. 1, 1986

[54] MOS DYNAMIC LOAD CIRCUIT FOR SWITCHING HIGH VOLTAGES AND ADAPTED FOR USE WITH HIGH THRESHOLD TRANSISTORS

[75] Inventors: Robert J. Proebsting, Plano; Donald R. Dias, Carrollton, both of Tex.

[73] Assignee: Mostek Corporation, Carrollton, Tex.

[21] Appl. No.: 454,055

[22] Filed: Dec. 28, 1982

[51] Int. Cl.⁴ .................. H03K 17/10; H03K 17/693
[52] U.S. Cl. ............................ 307/296 R; 307/448;
    307/453; 307/481; 307/246; 307/577; 307/264
[58] Field of Search .................. 307/200 B, 448, 453,
    307/481, 482, 246, 577, 578, 582–584, 264, 269,
    270, 296 R

[56] References Cited

U.S. PATENT DOCUMENTS

| | | | |
|---|---|---|---|
| 3,909,627 | 9/1975 | Mizuno | 307/453 |
| 3,938,108 | 2/1976 | Salsbury et al. | 307/482 X |
| 4,322,675 | 3/1982 | Lee et al. | 307/200 B |
| 4,352,996 | 10/1982 | White, Jr. | 307/269 |
| 4,354,123 | 10/1982 | Eaton, Jr. | 307/482 X |
| 4,451,748 | 5/1984 | Amrany | 307/270 X |

Primary Examiner—Stanley D. Miller
Assistant Examiner—D. R. Hudspeth

[57] ABSTRACT

A dynamic load circuit (34) selectively applies a high voltage state to a circuit node (42). A clock signal is coupled to a first node (54) and the inverse of the clock signal is coupled to a second node (60). Isolation transistors (50, 70) are controlled by the voltage level at the circuit node (42) to isolate the clock signals from the first and second nodes (54, 60) when the circuit node (42) is at a low voltage state. A high voltage signal $V_{pp}$ is coupled through a transistor (58) to the first node (54). The voltage at the first node (54) is coupled through a transistor (56) to the circuit node (42). The circuit node (42) is further coupled through transistors (62, 64) to the second node (60). The application of the alternating positive transistions of the clock and inverse clock signal cause the circuit (34) to apply a progressively increasing voltage to the circuit node (42). The dynamic load circuit (34) functions even if the threshold voltages of the high voltage transistors therein are almost as high as the supply voltage.

26 Claims, 2 Drawing Figures

MOS DYNAMIC LOAD CIRCUIT FOR SWITCHING HIGH VOLTAGES AND ADAPTED FOR USE WITH HIGH THRESHOLD TRANSISTORS

TECHNICAL FIELD

The present invention generally relates to integrated electronic circuits and in particular pertains to a load circuit which drives a circuit node, when selected, to a high voltage state derived from a high voltage supply while drawing essentially no current from the high voltage supply when the circuit node is not selected.

BACKGROUND OF THE INVENTION

The technology has recently been developed for the production of high-quality thin dielectrics which make possible the commercial utilization of the Fowler-Nordheim electron tunneling mechanism. This process can be used in the operation of electrically erasable programmable read only memory (EEPROM) devices. The electron tunneling permits the storage of a charge on a floating gate for an extended period of time even when operating power has been removed from the memory device.

The programming of a memory cell using the Fowler-Nordheim mechanism for present thin dielectrics requires approximately 20 volts. However, the standard power supply for microprocessor and memory circuits is 5 volts. The required high voltage can be produced by charge pump circuits which are fabricated integrally with the memory device. Although charge pump circuits can produce this required high voltage, these circuits can provide only a very limited current with reasonably sized devices. Thus, it is necessary that selected load elements draw only a small current from the charge pump while nonselected load elements exhibit a high impedance to prevent loading the charge pump.

A particular difficulty in the design of dynamic load circuits to carry out the above-listed requirements is that the application of high voltages to the source terminals of the MOS transistors tends to substantially increase the threshold voltages of the transistors. This is termed "body effect". This increase in threshold voltage must be accounted for so that the required high voltage can be produced for application to the Fowler-Nordheim circuit element. A method for controlling the threshold voltage of the transistors in the dynamic load circuit is to carefully regulate the processing steps in the manufacture of the memory device. This careful regulation of the processing steps can significantly increase the per unit cost of the memory devices.

Therefore, in view of the requirement to have a load control circuit for programming EEPROM circuits, there exists a need for such a circuit which can carry out the functions of driving a circuit node, when selected, to approximately the charge pump voltage, while drawing essentially no current from the charge pump when the circuit node is not selected, but at the same time having a relatively broad range of the threshold voltages for the dynamic load circuit transistors thereby not imposing strict processing controls.

SUMMARY OF THE INVENTION

A selected embodiment of the present invention comprises a dynamic load circuit for producing a high voltage state at a circuit node. The dynamic load circuit includes a circuitry which is responsive to a first clock signal for boosting the voltage at a first node and circuitry for coupling the first node to the circuit node. Further circuitry is included for coupling the circuit node to a second node. Additional circuitry is responsive to a second clock signal for boosting the voltage at the second node. The dynamic load circuit includes circuitry which is responsive to the voltage state at the second node for coupling a high voltage input signal to the first node. The clock signals progressively boost the voltages at the first and second nodes to produce the high voltage state at the circuit node.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
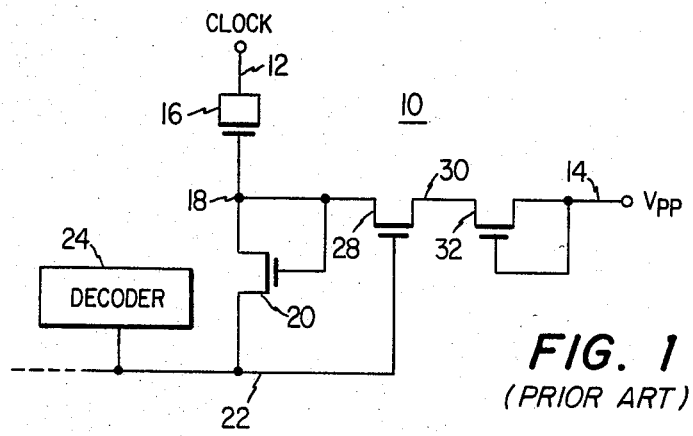
FIG. 1 is a schematic diagram illustrating a prior art circuit which serves to provide a high voltage signal to a circuit node.

A prior art dynamic load circuit 10 is illustrated as a schematic diagram in FIG. 1. The circuit 10 receives a clock signal through a line 12 and a high voltage charge pump signal $V_{pp}$ through a line 14. The clock signal is input to the source and drain terminals of a transistor 16 which has the gate terminal thereof connected to a node 18.

A transistor 20 has the drain terminal thereof connected to node 18 and the source terminal thereof connected to a circuit node 22. The gate terminal of transistor 20 is connected to the node 18.

A decoder 24 is responsive to an address signal to selectively drive node 22 to either a high state, at least $V_{CC}$-$V_T$, or to ground. The node 22 is coupled through circuitry, not shown, to a charge storage element which includes a thin oxide layer and operates by means of the Fowler-Nordheim tunneling mechanism.

A transistor 28 has the drain and source terminals thereof connected between node 18 and a node 30. The gate terminal of transistor 28 is connected to the circuit node 22.

The high voltage signal at line 14 is provided to the drain and gate terminals of a transistor 32 which has the source terminal thereof connected to node 30.

Operation of the prior art load control circuit 10 is now described in reference to FIG. 1. The typical supply voltage ($V_{CC}$) for the circuit 10 is 5 volts with the clock signal oscillating between 0 and 5 volts. The pump voltage $V_{pp}$ is typically 20 volts.

Note that the transistor 16 functions as a switch capacitor. When the voltage at the gate is less than one threshold above the voltage of the source and drain terminals, there is no channel formed and the capacitance between line 12 and the node 18 is very low. But, when the voltage at the gate of transistor 16 is greater than the voltage at the source and drain terminals by at least the threshold voltage of the transistor, a channel is formed and there is a relatively high capacitance between the line 12 and node 18.

In a first example, assume that the circuit node 22 is held at circuit ground by the decoder circuit 24. The low voltage state at the circuit node 22 causes the transistor 28 to be turned off, thereby preventing any conduction from the high voltage signal $V_{pp}$. The transistor 20 is connected in a diode configuration such that the voltage at node 18 is no greater than one threshold voltage ($V_T$) above that at the circuit node 22. The transistor 20 preferably has a lower threshold voltage than the transistor 16, thereby preventing the forming of a channel and the production of a high capacitance across transistor 16. Thus, the clock signal is effectively blocked from node 18. Node 18 remains at a low voltage state and no current is drawn through transistor 20; therefore, essentially no current is drawn from the $V_{pp}$ supply. When the circuit node 22 is set to a low voltage state, the circuit 10 does not attempt to drive the circuit node 22 to a higher voltage state.

In a second example, assume that the circuit node 22 is driven by the decoder 24 to a high logic level state which is at least $V_{CC}$-$V_T$. The circuitry connected to node 22 permits node 22 to be driven to higher voltage levels without drawing current from node 22. Assuming that $V_T$ for each of the transistors in FIG. 1 is 1.0 volts and we have a 5.0 volt supply with $V_{PP}$ at 20 volts, the node 30 will be driven to 19 volts through transistor 32. The drain of transistor 28 is at 19 volts but the gate is at only 5 volts. The source terminal of transistor 28 can therefore be brought only up to within one $V_T$ of the voltage at the gate terminal thereof. Node 18 is thus driven to 4 volts for a 1.0 volt $V_T$.

When the clock signal at line 12 is at 0 volts and node 18 is at 4 volts, there is a channel formed in the transistor 16 which provides a high capacitive coupling between the clock signal and node 18. When a positive going pulse arrives, the voltage at node 18 will be boosted due to the capacitive coupling of transistor 16. This boosts the voltage at node 18 from approximately 4 volts to about 8 volts This in turn raises the voltage at the circuit node 22 to approximately 7 volts. When the clock signal at line 12 returns to ground, the capacitance of the channel of transistor 16 tries to return node 18 back to 4 volts. But with the gate voltage at transistor 28 increased to 7 volts, the voltage at node 18 will be maintained at approximately 6 volts since there is still a 19 volt signal at node 30, thereby establishing a 6 volt charge across transistor 16. When the clock signal at line 12 goes back to 5 volts, node 18 is capacitively driven to about 10 volts, thereby bringing the circuit node 22 to 9 volts. As additional clock pulses are received, the voltage at node 18 and the resulting voltage at the circuit node 22 will be stepped upward. This operation produces the high voltage drive signal at the circuit node 22.

MOS circuits designed for 5 volt nominal operation are typically required to operate with a supply voltage as low as 4 volts. Further, the typical $V_T$ for an MOS transistor with the source substantially greater than 5 volts will likely be at least 2 volts. But when the threshold voltage of the transistors in circuit 10 exceeds one-half of the supply voltage, the circuit 10 ceases to boost the voltage at the circuit node 22. Assume, for example, that the circuit node 22 is at 10 volts, at which point the body effect causes the transistor threshold voltage to be 2.0 volts. Further assume that the power supply for circuit 10 is 4.0 volts so the clock signal at line 12 transitions between 0 and 4.0 volts. When the circuit node 22 is at 10.0 volts, transistor 28 brings node 18 up to 8.0 volts (with the clock at line 12 originally at 0 volts). When the clock goes from 4 to 4.0 volts, node 18 is driven to only 12 volts less any capacitive division. But since transistor 20 has a 2.0 volt threshold, no additional charge is transferred to the circuit node 22.

The circuit 10 thus has the limitation that it will cease functioning when the $V_T$ of the transistors exceeds one-half the supply voltage. Therefore, the circuit must be manufactured to maintain the maximum $V_T$ of the transistors to be less than one-half of the minimum supply voltage. In the example presented above, the minimum supply voltage is 4 volts, thus the maximum threshold voltage is 2 volts. It is difficult to manufacture an MOS device in quantity while holding the threshold voltage, including body effect at high source terminal voltages, to such a limited level.

The present invention reduces the problem of the constraint on the allowable threshold level of the transistors used in a dynamic load circuit.

Figure 2:
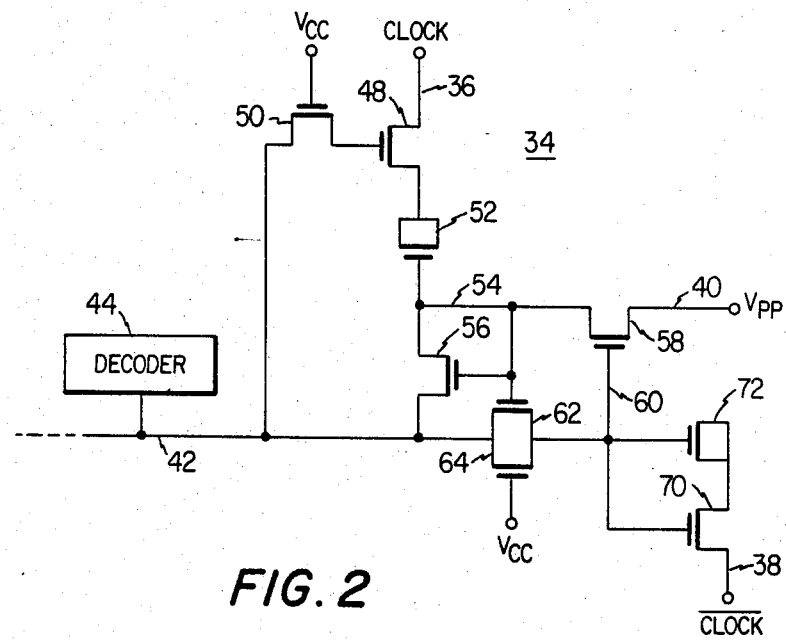
FIG. 2 is a schematic diagram illustrating the circuit of the present invention which functions to provide a high voltage signal to a selected circuit node, offer a high impedance to a charge pump circuit for a nonselected circuit node, isolate the clock signals from the nonselected dynamic load circuit and provide a relatively broad range of operable MOS transistor threshold voltages to reduce processing limitations.

A dynamic load circuit 34 in accordance with the present invention is illustrated in FIG. 2. A clock signal is input through a line 36 and the inverse of the clock signal, CLOCK, is input through a line 38. A high voltage signal $V_{pp}$, which is produced by a charge pump, is input through a line 40. The circuit 34 serves to produce a relatively high voltage signal for driving a circuit node 42.

A decoder 44 is responsive to an address signal to selectively drive circuit node 42 to either a high state, typically $V_{CC}$-$V_T$ or to ground. Node 42 can be driven to voltage states above $V_{CC}$-$V_T$ without decoder 44 drawing current from node 42. The node 42 is coupled through circuitry, not shown, to a charge storage element which preferably uses the Fowler-Nordheim tunneling mechanism. The decoder 44 represents a general driver element which could also be, for example, an address buffer or a bit line.

The clock signal at line 36 is provided to the drain terminal of a transistor 48. A transistor 50 has the source and drain terminals thereof connected between the circuit node 42 and the gate terminal of transistor 48. The gate terminal of transistor 50 is connected to a power terminal $V_{CC}$.

A capacitor 52 comprises a transistor which has the drain and source terminals thereof connected to the source terminal of transistor 48. The gate terminal of the transistor comprising capacitor 52 is connected to a node 54. A transistor 56 has the drain and gate terminals thereof connected to node 54 and the source terminal thereof connected to the circuit node 42.

A transistor 58 has the drain and source terminals thereof connected between node 54 and the high voltage input at line 40. The gate terminal of transistor 58 is connected to a node 60.

A transistor 62 has the drain and source terminals thereof connected between the circuit node 42 and the node 60 and has the gate terminal thereof connected to node 54. A transistor 64 has the drain and source terminals thereof connected between the circuit node 42 and the node 60 and has the gate terminal thereof connected to the power terminal $V_{CC}$.

The inverse of the clock signal is transmitted through line 38 to the drain terminal of a transistor 70 which has the gate terminal thereof connected to node 60. A transistor comprising a capacitor 72 has the drain and source terminals thereof connected together and to the source terminal of transistor 70. The transistors comprising capacitors 52 and 72 can be either enhancement or depletion type. The gate terminal of the transistor comprising capacitor 72 is connected to node 60.

Operation of the dynamic load circuit 34 is now described in reference to FIG. 2. The circuit elements 52 and 72 function as capacitors. The stray capacitance at nodes 54 and 60 preferably is substantially less than the capacitance of capacitors 52 and 72.

When the circuit node 42 is driven by decoder 44 to a logically low voltage state, essentially 0 volts are passed through the transistors 50 and 64 to the gate terminals of transistors 48 and 70. This low voltage state serves to render the transistors 48 and 70 nonconductive. In this condition, the clock and inverse clock signals are isolated from the high capacitance of the source/drain connections of the transistors comprising capacitors 52 and 72, thereby providing a high impedance to the clock driver circuits at lines 36 and 38. The low voltage state at node 60 further turns off transistor 58, thereby providing high impedance between the high voltage signal $V_{PP}$ and node 54. As a result, node 54 stays at a low voltage state and there is no tendency to pull up the voltage at the circuit node 42. Therefore, for each circuit node, such as 42, that is not selected, there is no loading applied to the charge pump circuit which produces the high voltage signal $V_{PP}$.

The operation for the condition when the circuit node 42 is driven by decoder 44 to a logically high voltage state, approximately 5 volts, is now described. The high voltage state at the circuit node 42 serves to render conductive the transistors 48 and 70, which in turn couples the clock signal to the capacitor 52 and the inverse of the clock signal to the capacitor 72. Since the node 60 is brought by transistor 64 to the supply voltage less one transistor threshold voltage, the transistor 58 is also turned on to couple charge from the pump signal $V_{PP}$ to the node 54. Since the gate voltage on the transistor 58 is substantially less than the voltage $V_{PP}$, the voltage at node 54 will be the gate voltage of transistor 58 less one transistor threshold voltage.

The transistors 50 and 64 serve to isolate the gate capacitance of the transistors 48 and 70 so that the clock signals can bootstrap the gate terminals of transistors 48 and 70. This permits the full amplitude of the clock signals to be passed through the transistors 48 and 70.

When the $\overline{CLOCK}$ signal at line 38 is at ground, transistor 64 brings node 60 up to $V_{CC}$ minus one threshold voltage ($V_T$) since the gate voltage of transistor 64 is at $V_{CC}$. When the positive going transition of the $\overline{CLOCK}$ signal at line 38 is received, node 60 is capacitively boosted approximately 5 volts by capacitor 72.

The increased voltage at node 60 tends to increase the voltage at node 54 while the clock signal at line 36 is at ground. When the clock signal then transitions to 5 volts, capacitor 52 further increases the voltage on node 54, which in turn elevates the voltage at the circuit node 42 through the transistor 56. This in turn increases the voltage on node 60 by conduction of transistor 62. This cycle of operation repeats such that the clock signals continue to boost the voltages at nodes 60, 54, and 42. This process is terminated when a desired voltage is reached for the circuit node 42 or when a maximum voltage of $V_{PP}+[V_{CC}-V_T]$ is reached.

A number of the transistors in circuit 34 are exposed to voltage states above the normal 5 volt operating supply. As the voltages at the source terminals of the transistors become elevated, there is an increase in the $V_T$ of the transistors due to the body effect mentioned earlier. Note, however, that the circuit 34 pumps the voltage at the circuit node 42 upward toward the limit as long as the $V_T$ of the transistors is less than the supply voltage. For the prior art circuit 10 shown in FIG. 2, the $V_T$ of the transistors cannot exceed one-half of the supply voltage in order to boost the voltage at the circuit node 22 as discussed above. Thus, the circuit 34 has a much greater tolerance for an increase in the $V_T$ due to the body effect. This results in having a must less strict processing requirement for the manufacturer of the circuit 34 than for the circuit 10 shown in FIG. 1.

An operational example is now presented for the circuit 34 shown in FIG. 2. In a typical configuration, the supply $V_{CC}$ is 5.0 volts and the high voltage pump signal $V_{PP}$ is 20 volts. The $V_T$ for each of the transistors is assumed to be 2 volts when either of the terminals of the transistor are at less than 5 volts and the $V_T$ is assumed to be 4 volts when both of the terminals are at greater than 5 volts. This approximation is useful for understanding the operation of the circuit. Perfect capacitive coupling is assumed, although the actual coupling will be somewhat less.

When circuit node 42 is selected, it is charged by the decoder 44 to at least the supply voltage less the threshold voltage of circuit 44, and in the present example is initially charged to 3 volts. The 3 volt level is propagated to the node 60 by transistor 64.

When the inverse clock signal transitions from the 0 to 5 volt state, the source/drain terminals of the transistor comprising capacitor 72 are boosted to 5 volts which in turn capacitively couples the voltage at node 60 from 3 to 8 volts which permits the source and drain terminals of the transistor comprising capacitor 72 to be driven to the full 5.0 volt level. The 8 volt level on node 60 permits transistors 70 to remain conductive through the switching transient as node 60 remains more than 2 volts more positive than the source of transistor 70. The 8 volt level at node 60 in turn drives the voltage at node 54 to 4 volts due to an assumed 4.0 volt $V_T$ of transistor 58. The selection of a 4.0 volt $V_T$ for transistor 58 is independent of the assumed $V_T$ levels noted above. During this time the clock signal is at 0 volts which causes the capacitor 52 to be charged to 4 volts.

When the clock signal makes the transition from 0 to 5 volts, the gate terminal of transistor 48 is boosted to 8 volts, which drives the source and drain terminals of capacitor 52 to 5 volts which in turn drives the node 54 to 9 volts. This 9 volts produces a 5 volt level at the circuit node 42 due to the conduction of transistor 56 and a 5 volt level at the node 60 due to the conduction of transistor 62.

When the inverse clock signal then transitions from 0 to 5 volts, the node 60 is driven from 5 to 10 volts. The 10 volt level at node 60 produces a 6 volt level at node 54 charging capacitor 52 to 6 volts while the clock signal at line 36 is at 0 volts.

When the clock signal again transitions from 0 to 5 volts, the voltage at node 54 is driven from 6 to 11 volts, thereby increasing the voltage at the circuit node 42 to 7 volts. This also produces a 7 volt level at node 60 during which time the inverse clock signal is at ground.

When the inverse clock signal transitions from 0 to 5 volts, the node 60 is driven from 7 to 12 volts with a resulting 8 volts being produced at node 54 while the clock signal is at 0 volts.

When the clock signal again transitions from 0 to 5 volts, the node 54 is driven from 8 to 13 volts with a resulting increase in the voltage at circuit node 42 to 9 volts. Node 60 is also driven to 9 volts.

After the transition of the inverse clock signal from 0 to 5 volts, the node 60 is charged to 14 volts which drives node 54 to 10 volts.

From the above incremental description of the charge production, it can be seen that the voltage on the circuit node 42 is gradually increasing as additional clock pulses and inverse clock pulses are received. It can also be seen that the circuit 34 in FIG. 2 does not cease operating when the threshold voltage of the high voltage transistors exceeds onehalf of the supply voltage. The circuit 34, in fact, charges the circuit node 42 to the maximum voltage as long as the $V_T$ of the circuit 34 transistors does not exceed the supply voltage.

Each of the transistors described herein is a N-channel enhancement type MOS transistor unless noted otherwise. However, equivalent circuits can be produced with P-channel transistors.

In an alternate configuration of the circuit 34, the capacitors 52 and 72 can be actual capacitors instead of transistors. In a further alternate configuration, either or both of the transistors comprising capacitors 52 and 72 may have one of the source or drain terminals thereof open.

In a still further configuration of the present invention, the transistors 48 and 50 can be deleted with line 36 connected directly to capacitor 52 which must then be a switched capacitor. The transistor 70 may also be deleted with line 38 connected directly to capacitor 72 which also must be a switched capacitor.

In the preferred embodiment of the present invention, the CLOCK and $\overline{\text{CLOCK}}$ signals are inverses. However, for the proper operation of the circuit 34, the CLOCK and $\overline{\text{CLOCK}}$ signals must only meet the requirement that during one portion of a full cycle, CLOCK is at a high voltage state, and $\overline{\text{CLOCK}}$ is at a low voltage state, and during a second portion of the repetitive cycle, CLOCK is at a low voltage state and $\overline{\text{CLOCK}}$ is at a high voltage state. It is acceptable if both signals are at the low voltage state or the high voltage state simultaneously.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

We claim:

1. A dynamic load circuit for producing a high voltage level in excess of the logic voltage levels at a circuit node, comprising:
   means responsive to a first clock signal for boosting the voltage at a first node,
   means for coupling said first node to said circuit node,
   means for coupling said circuit node to a second node,
   means responsive to a second clock signal for boosting the voltage at said second node wherein said first clock signal is at a high logic voltage level during a portion of the time that said second clock signal is at a low logic voltage level, and said first clock signal is at a low logic voltage level during a portion of the time that said second clock signal is at a high logic voltage level, and
   means responsive to the voltage level at said second node for coupling a high voltage input signal to said first node which in turn is at least partially transferred to said circuit node.

2. A dynamic load circuit as recited in claim 1 wherein said first clock signal is the inverse of said second clock signal.

3. A dynamic load circuit as recited in claim 1 wherein said means responsive to a first clock signal comprises a capacitor connected to couple said first clock signal to said first node.

4. A dynamic load circuit as recited in claim 1 wherein said means responsive to a first clock signal comprises a first transistor having at least one of the source and drain terminals thereof coupled to receive said first clock signal and having the gate terminal thereof connected to said first node, said first transistor configured to function as a capacitive element.

5. A dynamic load circuit as recited in claim 4 including:
   a second transistor having the source terminal thereof connected to the source and drain terminals of said first transistor and having the drain terminal connected to receive said first clock signal, and
   a third transistor having the source terminal thereof connected to said circuit node, the drain terminal thereof connected to the gate terminal of said second transistor and having the gate terminal thereof connected to a power terminal.

6. A dynamic load circuit as recited in claim 1 including means for selectively coupling said first clock signal to said first node in response to the voltage level at said circuit node.

7. A dynamic load circuit as recited in claim 1 wherein said means responsive to a second clock signal comprises a capacitor connected to couple said second clock signal to said second node.

8. A dynamic load circuit as recited in claim 1 wherein said means responsive to a second clock signal comprises a first transistor having at least one of the source and drain terminals thereof coupled to receive said second clock signal and having the gate terminal thereof connected to said second node, said first transistor configured to function as a capacitive element.

9. A dynamic load circuit as recited in claim 8 including:
   a second transistor having the source terminal thereof connected to the source and drain terminals of said first transistor and the drain terminal thereof connected to receive said second clock signal, and the gate terminal thereof connected to said second node.

10. A dynamic load circuits recited in claim 1 including means for selectively coupling said second clock signal to said second node in response to the voltage level at said circuit node.

11. A dynamic load circuit as recited in claim 1 wherein said means for coupling said first node to said circuit node comprises a transistor having the drain and gate terminals thereof connected to said first node and the source terminal thereof connected to said circuit node.

12. A dynamic load circuit as recited in claim 1 wherein said means for coupling said circuit node to a second node comprises a transistor having the gate terminal thereof connected to said first node and the drain and source terminals thereof connected between said circuit node and said second node.

13. A dynamic load circuit as recited in claim 10 including a transistor having the gate terminal thereof connected to a fixed voltage node and the source and drain terminals thereof connected between said circuit node and said second node.

14. A dynamic load circuit as recited in claim 1 wherein said means for coupling a high voltage input signal to said first node comprises a transistor having the drain terminal thereof connected to receive said high voltage input signal, the gate terminal thereof connected to said second node and the source terminal thereof connected to said first node.

15. A dynamic load circuit as recited in claim 1 including a transistor having the gate terminal thereof connected to said first node and the source and drain terminals thereof connected between said circuit node and said second node.

16. A dynamic load circuit for producing a high voltage level in excess of the logic voltage levels at a circuit node, comprising:
   first capacitive means for coupling a clock signal to a first node,
   second capacitive means for coupling the inverse of said clock signal to a second node,
   a first transistor having the gate and drain terminals thereof connected to said first node and the source terminal thereof connected to said circuit node,
   a second transistor having the gate terminal thereof connected to said second node and the source and drain terminals thereof connected between said first node and a high voltage input signal node, and
   means for coupling the voltage level at said circuit node to said second node.

17. A dynamic load circuit as recited in claim 16 wherein said first capacitive means comprises:
   a third transistor having the drain terminal thereof connected to receive said clock signal,
   a fourth transistor having the source and drain terminals thereof connected to the source terminal of said third transistor and having the gate terminal thereof connected to said first node, and
   a fifth transistor having the gate terminal thereof connected to a power terminal and having the source and drain terminals thereof connected between the gate terminal of said third transistor and said circuit node.

18. A dynamic load circuit for producing a high voltage signal as recited in claim 16 wherein said second capacitive means comprises:
   a third transistor having the drain terminal thereof connected to receive said inverse of said clock signal and the gate terminal thereof connected to said second node, and
   a fourth transistor having the source and drain terminals thereof connected to the source terminal of said third transistor and having the gate terminal thereof connected to said second node.

19. A dynamic load circuit for producing a high voltage signal as recited in claim 16 wherein said means for coupling the voltage level at said circuit node to said second node comprises an third transistor having the gate terminal thereof connected to said first node and having the source and drain terminals thereof connected between said circuit node and said second node.

20. A dynamic load circuit for producing a high voltage signal as recited in claim 16 wherein said means for coupling the voltage level at said circuit node to said second node comprises a third transistor having the gate terminal thereof connected to a power terminal and having the source and drain terminal thereof connected between said circuit node and said second node.

21. A dynamic load circuit for producing a high voltage signal as recited in claim 16 wherein said means for coupling the voltage level at said circuit node to said second node comprises an third transistor having the gate terminal thereof connected to said first node and having the source and drain terminals thereof connected between said circuit node and said second node, and
   a fourth transistor having the gate terminal thereof connected to said power terminal and having the source and drain terminals thereof connected between said circuit node and said second node.

22. A dynamic load circuit for producing a high voltage signal at a circuit node, comprising:
   a first transistor having the drain terminal thereof connected to receive a clock signal,
   a second transistor having the drain and source terminals thereof connected to the source terminal of said first transistor and having the gate terminal thereof connected to a first node,
   a third transistor having the drain and source terminals thereof connected between said circuit node and the gate terminal of said first transistor and having the gate terminal thereof connected to a power terminal,
   a fourth transistor having the drain and gate terminals thereof connected to said first node and the source terminal thereof connected to said circuit node,
   a fifth transistor having the drain and source terminals thereof connected between said circuit node and a second node and having the gate terminal thereof connected to said power terminal,
   a sixth transistor having the drain and source terminals thereof connected between said circuit node and said second node and having the gate terminal thereof connected to said first node,
   a seventh transistor having the drain terminal thereof connected to receive the inverse of said clock signal and having the gate terminal thereof connected to said second node,
   an eighth transistor having the drain and source terminals thereof connected to the source terminal of the seventh transistor and having the gate terminal thereof connected to said second node, and
   a ninth transistor having the source and drain terminals connected between said first node and a high voltage input signal node, and having the gate terminal thereof connected to said second node.

23. A method for producing a high voltage level in excess of the logic voltage levels at a circuit node, comprising the steps of:
   selectively applying a first clock signal through a capacitive coupling to boost the voltage at a first node,
   selectively applying a second clock signal through a capacitive coupling to boost the voltage at a second node, wherein said first clock signal is at a high logic voltage level during a portion of the time that said second clock signal is at a low logic voltage level, and said first clock signal is at a low logic voltage level during a portion of the time that said second clock signal is at a high logic voltage level,
   coupling a high voltage input signal to said first node in response to the voltage at said second node, coupling said first node to said circuit node to produce said high voltage signal thereat, and
coupling the high voltage signal at said circuit node to said second node in response to the voltage level at said first node.

24. A method as recited in claim 23 wherein the steps of selectively applying comprises driving one of said clock signals to a low logic voltage level when the other of said clock signals is at a high logic voltage level.

25. A method for producing a high voltage level as recited in claim 23 including the step of isolating said first clock signal from said first node and isolating said second clock signal from said second node when said circuit node is at less than a predetermined voltage level.

26. A method for producing a high voltage level as recited in claim 23 wherein the steps of selectively applying a first clock signal to boost the voltage at a high node and selectively applying a second clock signal to boost the voltage at a second node occur alternately.

* * * * *